(12) United States Patent
Ueda et al.

(10) Patent No.: US 7,632,627 B2
(45) Date of Patent: Dec. 15, 2009

(54) PHOTOMASK APPARATUS, PHOTOMASK MANUFACTURING METHOD, AND MASK PATTERN FORMING METHOD

(75) Inventors: Masanori Ueda, Kawasaki (JP); Haruyuki Matsunaga, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 707 days.

(21) Appl. No.: 11/017,715

(22) Filed: Dec. 22, 2004

(65) Prior Publication Data
US 2006/0035157 A1    Feb. 16, 2006

(30) Foreign Application Priority Data
Aug. 11, 2004    (JP) ............... 2004-234716

(51) Int. Cl.
*H01L 21/00* (2006.01)
*G03F 9/00* (2006.01)
(52) U.S. Cl. .................. 430/313; 430/5; 430/311
(58) Field of Classification Search .......... 430/5, 430/311, 313
See application file for complete search history.

(56) References Cited

U.S. PATENT DOCUMENTS

| | | | |
|---|---|---|---|
| 5,596,386 A * | 1/1997 | Hankawa ............... | 396/110 |
| 5,965,329 A * | 10/1999 | Sakaki et al. ............ | 430/320 |
| 6,019,784 A * | 2/2000 | Hines ............... | 128/898 |
| 6,576,406 B1 * | 6/2003 | Jacobsen et al. ......... | 430/322 |

FOREIGN PATENT DOCUMENTS

| | | |
|---|---|---|
| JP | 56-41639 | 4/1981 |
| JP | 63-144888 | 6/1988 |
| JP | 5-191015 | 7/1993 |

\* cited by examiner

*Primary Examiner*—Mark F Huff
*Assistant Examiner*—Jonathan Jelsma
(74) *Attorney, Agent, or Firm*—Staas & Halsey LLP

(57) ABSTRACT

A light non-transmitive layer and resist are coated on a surface of a mask. By carrying out exposing, developing, and etching, a positive/negative reversed pattern is formed on the surface of the mask. A light non-transmitive layer and a resist are coated on a portion of the workpiece where the pattern is to be formed. Exposure is carried out by using the mask that can be changed by a connector. The pattern of the mask is transferred to the resist, and the resist is developed. After the resist is developed, a mask pattern is formed on a surface of the workpiece by etching.

4 Claims, 10 Drawing Sheets

PHOTOMASK APPARATUS, PHOTOMASK MANUFACTURING METHOD, AND MASK PATTERN FORMING METHOD

BACKGROUND OF THE INVENTION

1) Field of the Invention

The present invention relates to a technology for forming a photomask.

2) Description of the Related Art

Conventionally, when forming a pattern (e.g., herringbone grooves or the like) on a surface of a workpiece (e.g., a shaft, a bearing, or the like), one approach is to form an electrode having a shape corresponding to the pattern and transfer the electrode by electrolytic processing or electric discharge machining or the like.

This approach requires provision of a gap, for flow of the working fluid, between the electrode and the workpiece, moreover, the workpiece is not masked, so that setting optimal electrolysis conditions or electric discharge conditions becomes a difficult task. In addition, the electrode gets worn.

As a countermeasure, Japanese Patent Application Laid-open No. H5-191015 discloses a technique of forming a coat of a light non-transmitive layer and photo sensitive resin on a surface of the workpiece, exposing the coat with the mask, and developing and removing portions that are not exposed.

Japanese Patent Application Laid-open No. S63-144888 discloses a technique of efficiently raising over a broad range the temperature of a photo sensitive resin or the like Laser light or plural prisms or the like are used to achieve this effect.

Japanese Patent Application Laid-open No. S56-41639 discloses a technique of using an elastic material to have tight and close bonding between a mask and a photo sensitive resin or the like. With this arrangement, exposure can be carried out easily.

However, efficiency in forming the mask pattern is poor in the conventional techniques.

Specifically, the mask cannot be replaced easily because it is fixed to a supporting portion. If the workpiece has plural surfaces, and if the surfaces have various shapes, then a lot of time is wasted in replacing the mask, it puts a great burden on the person who performs the replacement.

SUMMARY OF THE INVENTION

It is an object of the present invention to at least solve the problems in the conventional technology.

A photomask apparatus according to an aspect of the present invention forms a pattern on a surface of a workpiece. The photomask apparatus includes a resist depositing unit that deposits resist on a portion of the workpiece; an exposure unit that transfers a pattern on a mask by exposing the mask with the pattern, the mask being exposed to a light from a light guiding cable with a connector; a developing unit that develops the resist with the pattern; and a etching unit that forms the pattern on the surface of the workpiece by etching.

A photomask manufacturing method according to another aspect of the present invention forming a light non-transmitive layer and a resist on a mask of a same shape as a workpiece, and exposing a pattern in which positive and negative are reversed; developing the resist, and forming, by etching, a master mask in which the pattern in which positive and negative are reversed is formed on the mask; forming a light non-transmitive layer and a resist on a mask used in order to carry out patterning of the workpiece, and fitting the master mask together therewith, and exposing from a side of the master mask; and developing the resist, and forming a pattern on the mask used in order to carry out the patterning by etching.

A mask pattern forming method according to still another aspect of the present invention that forms a pattern on a surface of a workpiece. The method includes depositing resist on a portion of the workpiece; transferring a pattern on a mask by exposing the mask with the pattern, the mask being exposed to a light from a light guiding cable with a connector; developing the resist with the pattern; and forming the pattern on the surface of the workpiece by etching.

The other objects, features, and advantages of the present invention are specifically set forth in or will become apparent from the following detailed description of the invention when read in conjunction with the accompanying drawings.

DETAILED DESCRIPTION

Exemplary embodiments of a photomask apparatus, a photomask manufacturing method, and a mask pattern forming method according to the present invention will be described below in detail with reference to the accompanying drawings.

Figure 1:
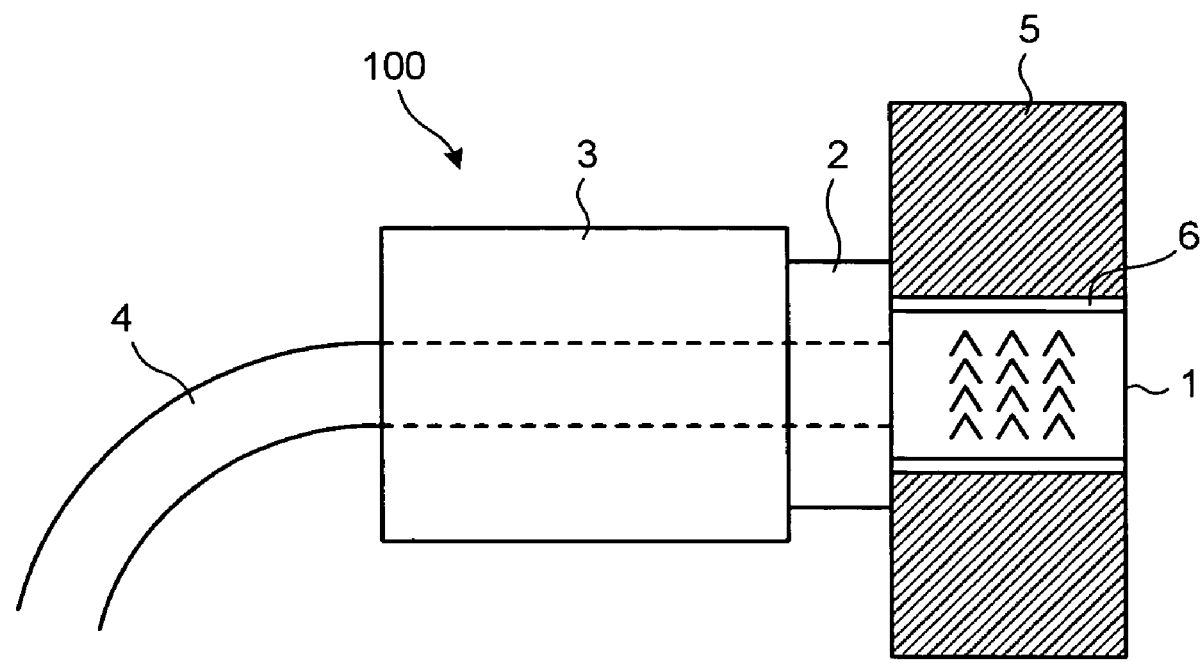
FIG. 1 is schematic of a photomask apparatus according to an embodiment of the present invention.

Embodiments of the present invention will be explained with reference to the accompanying drawings. FIG. 1 is schematic of a photomask apparatus 100 according to an embodiment of the present invention. The photomask apparatus 100 includes a supporting unit 3 and a connector 2. A mask 1 is detachably fit to the connector 2, and the connector 2 is fixed to the supporting unit 3. As a result, the mask 1 can be replaced easily.

The mask 1 is, for example, tubular or columnar, and a predetermined mask pattern is formed at the outer surface thereof. Glass, quartz, resin materials having high transparency, and the like may be used as the material of the mask 1. The resin material may be acryl, polycarbonate, polyester, polyethylene terephthalate (PET), and the like.

The mask 1 is connected to a light guiding cable 4 structured by a flexible optical fiber or the like. By using the flexible light guiding cable 4, the flexibility in the work layout increases, and the workability can be improved.

The light guiding cable 4 is connected to an exposure source (e.g., a UV light source, not shown). UV light irradiated from the exposure light source reaches the mask 1 via the light guiding cable 4, and can expose a mask pattern on a resist 6. The resist 6 is a photosensitive resist that is coated on an inner portion and side surfaces of a workpiece 5.

Figure 2:
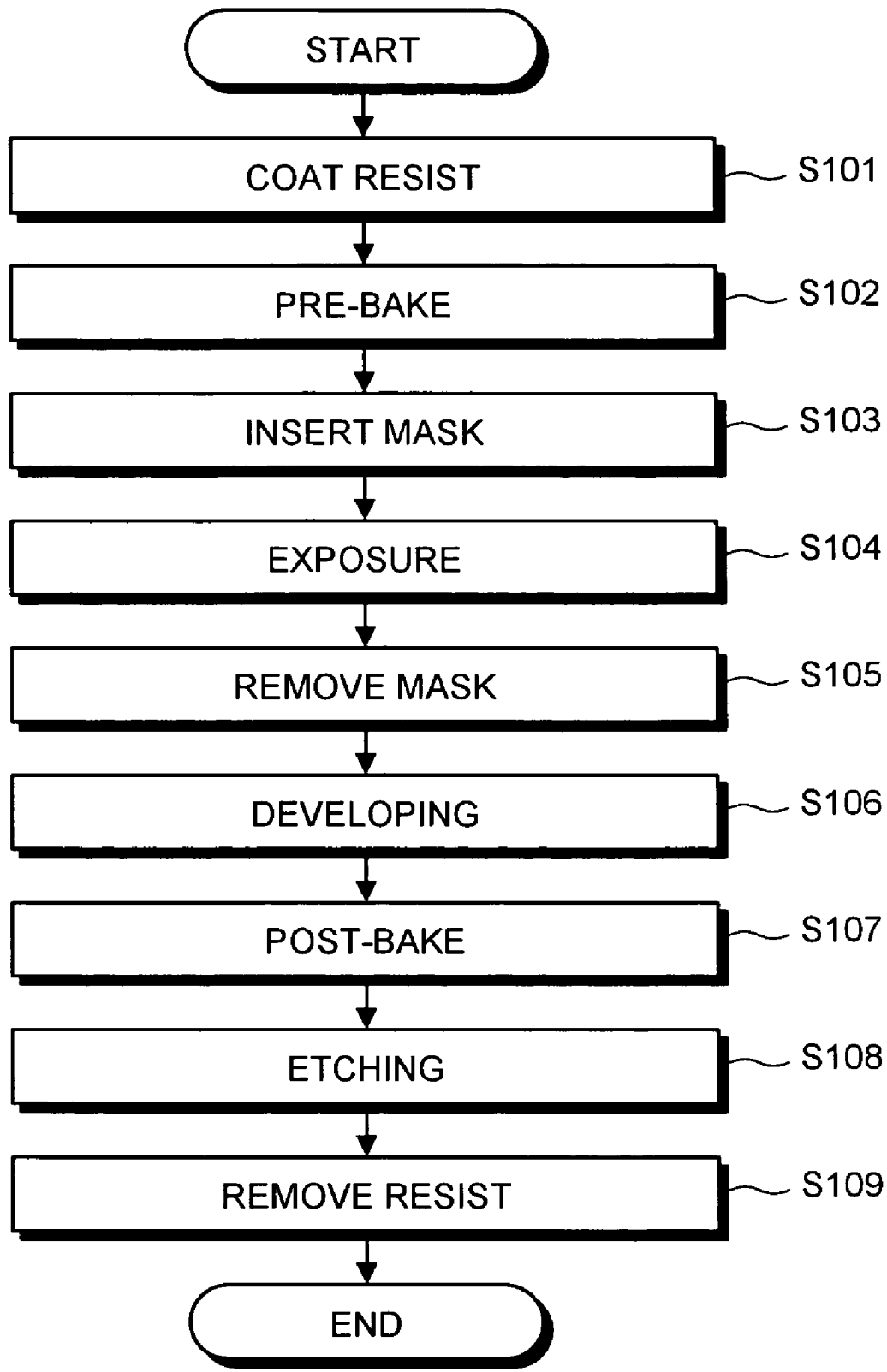
FIG. 2 is a flowchart of a process procedure by which the photomask apparatus forms a mask pattern on a workpiece.

Manufacturing processes, by which a photomask apparatus 100 forms a mask pattern on the workpiece 5, will be described. FIG. 2 is a flowchart of processing by which the photomask apparatus 100 forms the mask pattern on the workpiece 5.

As shown in FIG. 2, a resist is coated on the workpiece 5 (step S101). This is a coating of the resist onto surfaces of the workpiece 5 where the mask pattern is to be formed. Specifically, a small amount of a solution, in which the resist concentrate is diluted in a solvent, is dribbled, the excess is removed, and a resist 6 is coated.

Examples of the method of coating the resist are a dipping method in which an object is immersed in a resist solution, a method of utilizing flowing, spin coating, spraying, an electrodeposition method, and the like.

The coated resist is then pre-baked (step S102). Pre-baking raises a temperature of the resist to a predetermined temperature in order to evaporate or the like the solution within the resist coated at step S101.

The mask 1 is inserted in the workpiece 5 (step S103), and exposure is carried out (step S104). Specifically, the mask pattern of the mask 1 inserted in the workpiece 5 at step S103 is exposed on the coated resist.

The mask 1 is then removed from the interior of the workpiece 5 (step S105), and developing is carried out (step S106). This is developing (developing by, for example, a sodium carbonate solution or the like) in a state of being exposed on the resist 6 in FIG. 1, so as to transfer the mask pattern on the resist.

Post-baking is then carried out (step S107). This raises the temperature to a predetermined temperature in order to remove solvent and moisture within the resist 6 and to improve close contact with the workpiece 5.

Etching is then carried out (step S108). This forms a pattern of a predetermined depth by etching (e.g., etching by iron (II) chloride or the like) on the portions where the resist does not exist.

Chemical etching such as dry etching or wet etching, electrolytic etching, or the like, can be used as the method of etching. Plasma etching can be used as the dry etching. Iron (II) chloride, phosphoric acid, or the like can be used as the wet etching solution. Sodium chloride, sodium nitrate, or the like can be used as the solution for electrolytic etching.

The resist is then removed (step S109). The cured resist is removed by a peeling liquid (e.g., a sodium hydroxide solution, an organic solvent, or the like).

The resist 6 is coated on the portions of the workpiece 5 where the mask pattern is to be formed, the mask 1 is inserted in the workpiece 5, and exposure, developing, etching, and removal of the etching are carried out. Therefore, the mask pattern can be formed quickly.

Because the mask 1 can be easily replaced by the connector 2, the mask 1 can be fit together with the surface of the workpiece having an arbitrary shape, and the work efficiency can be improved.

Figure 3:
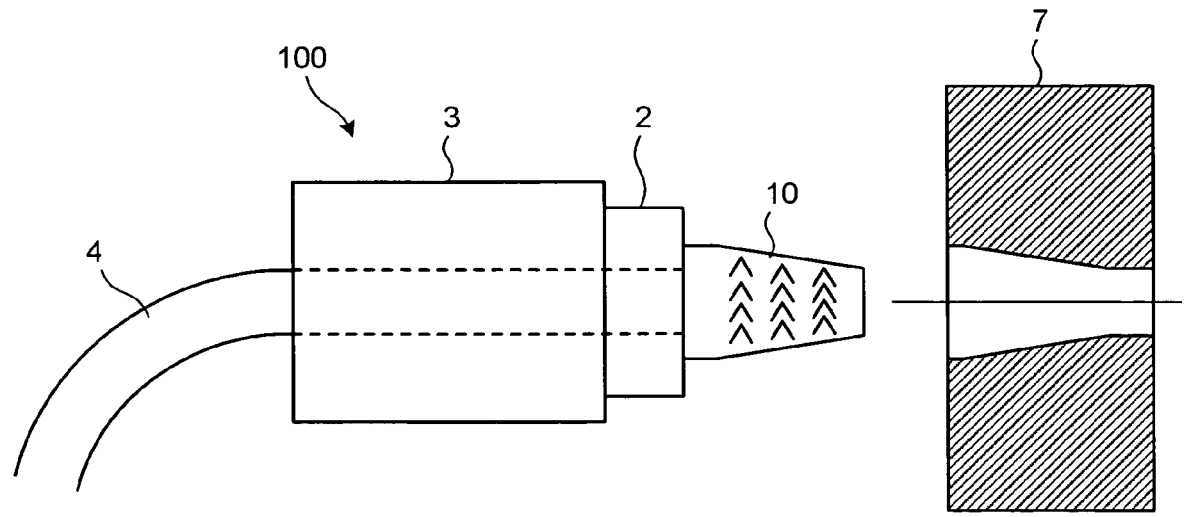
FIG. 3 is a schematic for explaining replacement of a mask.
Figure 4:
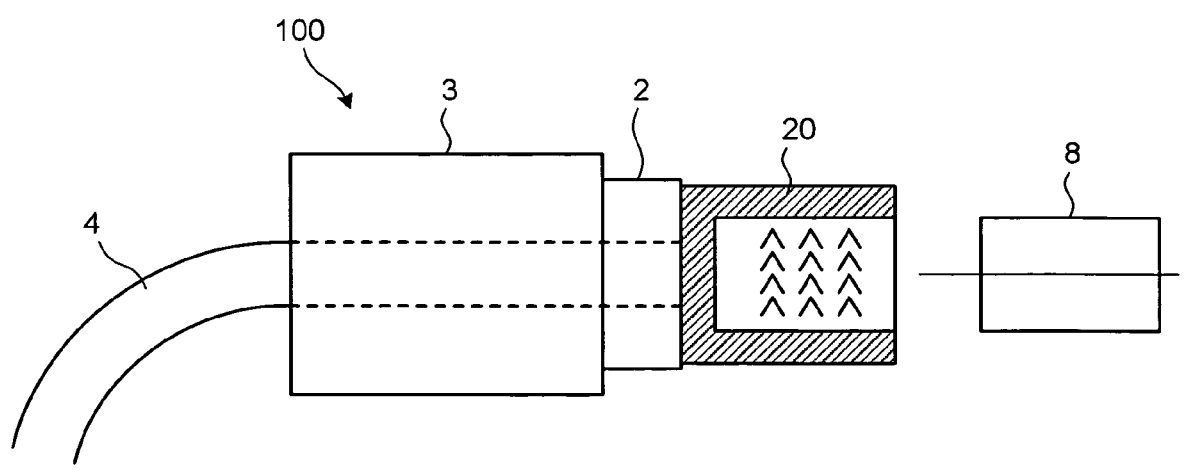
FIG. 4 is another schematic for explaining replacement of a mask.

Examples of exchanging the mask are shown in FIGS. 3 and 4. As shown in FIG. 3, even if an inner surface of a workpiece 7 is conical, the mask pattern can be easily formed at the inner surface of the workpiece 7, by replacing the mask 1 with a mask 10 having the same shape as this conical shape.

As shown in FIG. 4, when the mask pattern is to be formed on an outer surface of a workpiece 8, the mask 1 is replaced by a mask 20 having, at the interior thereof, a hole of the same shape as the workpiece 8, and the mask 20 can be fit on the exterior of the workpiece 8. By fitting the mask 20 onto the exterior of the workpiece 8, the mask pattern can be formed on the outer surface of the columnar workpiece 8. The resist is coated on the inner surface of the workpiece 7 and the outer surface of the workpiece 8 (the explanation thereof is omitted).

Figure 5:
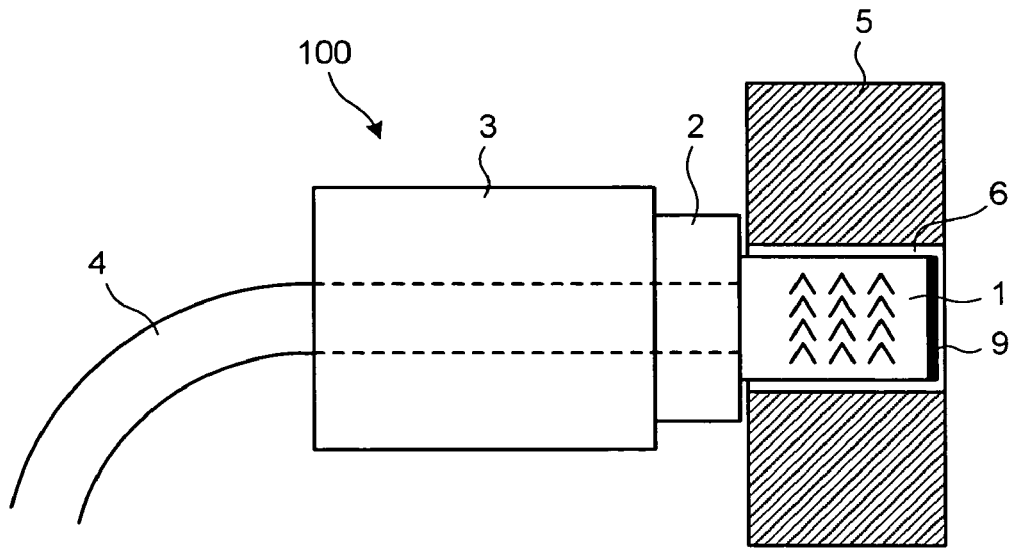
FIG. 5 is a schematic of a case in which a light reflecting layer is provided at an end portion of the mask.

As shown in FIG. 5, in the photomask apparatus 100, a light reflecting layer 9 or the like (e.g., a mirror or the like) may be provided at an end portion of the mask 1. By providing the light reflecting layer 9 at the end portion of the mask 1, non-uniformity of exposure due to leakage of light at the end portion of the mask 1 can be improved. Further, non-uniformity of exposure can be improved by similarly providing light reflecting layers at end portions of the masks 10 and 20 (the explanation thereof is omitted).

Figure 6:
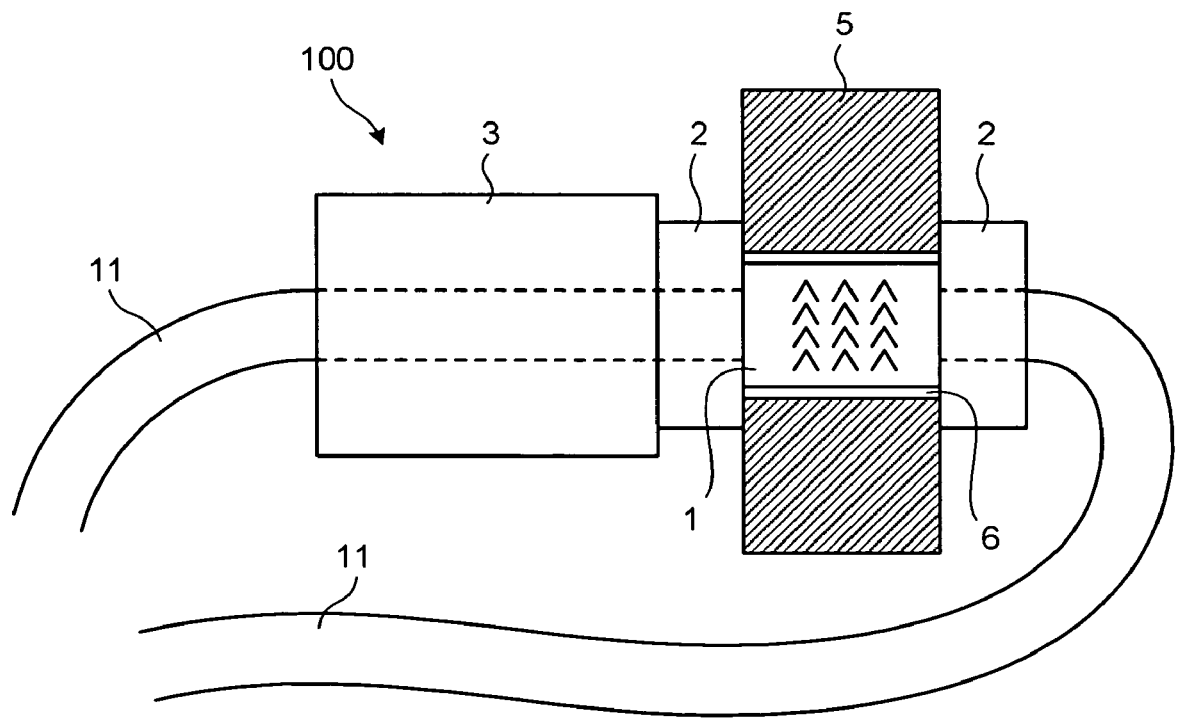
FIG. 6 is a schematic of a case in which light guiding cables are attached to both ends of the mask.

In the photomask apparatus 100, light guiding cables 11 can be attached to both ends of the mask 1 via the connectors 2 (as shown in FIG. 6). By connecting the light guiding cables 11 to the both ends of the mask 1 and making light incident from the both ends of the mask 1, the exposure amount can be made uniform, and the mask pattern can be formed precisely at the inner surface of the workpiece 5. The light guiding cables 11 can similarly be connected to both ends of the mask 10 and the mask 20.

Figure 7:
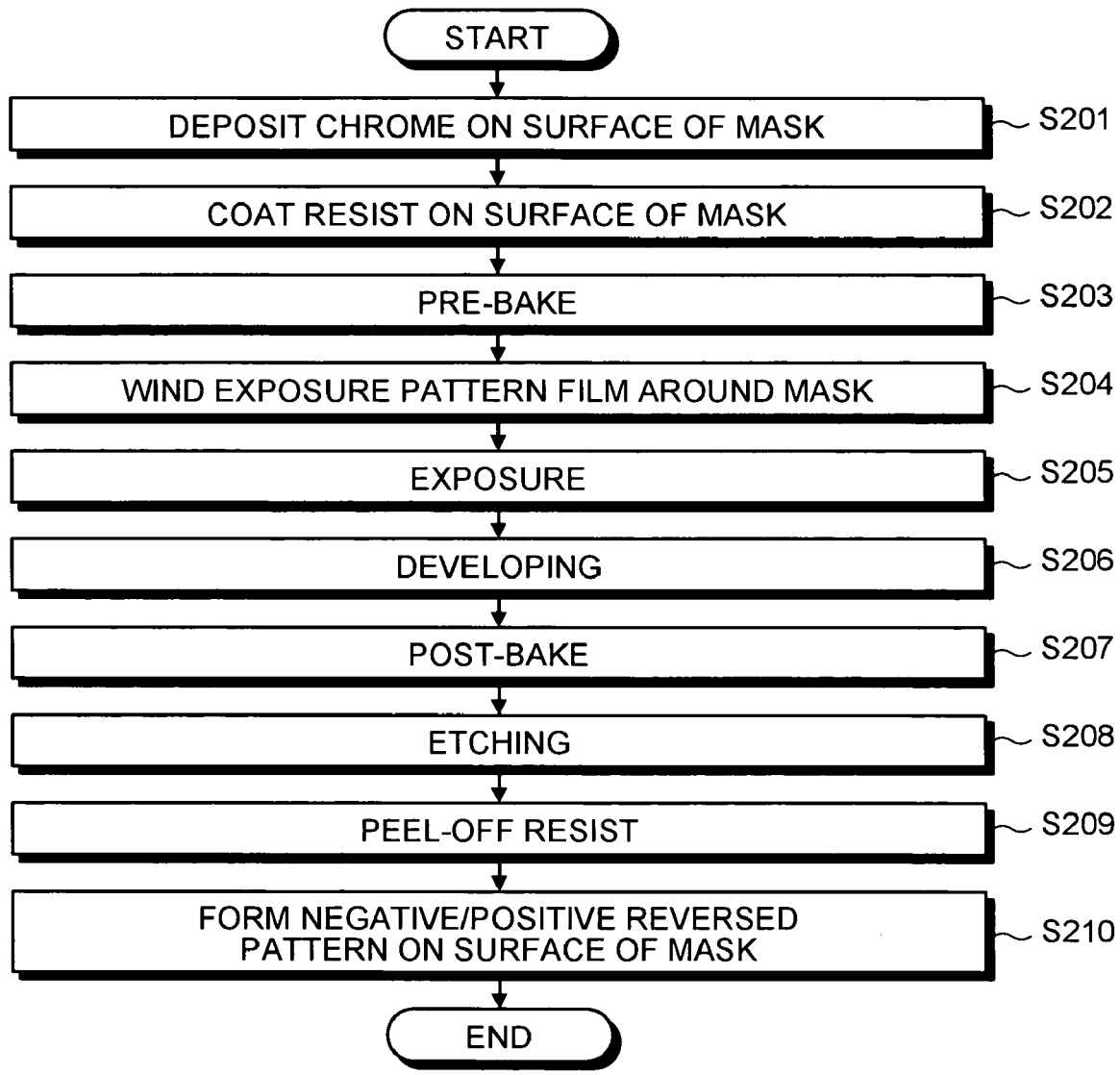
FIG. 7 is a flowchart of a process procedure for forming an exposure pattern onto an outer surface of a mask.
Figure 8:
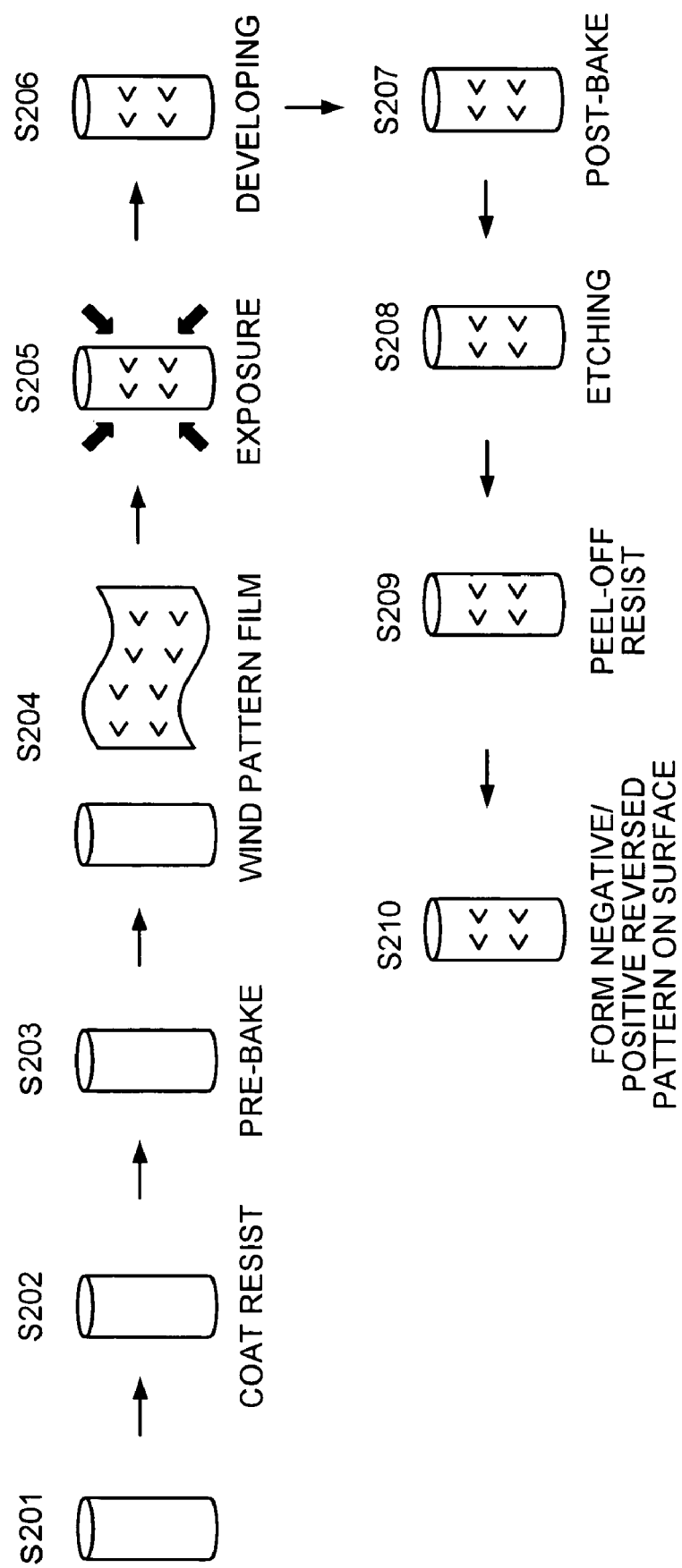
FIG. 8 is a schematic for explaining the process procedure shown in FIG. 7.

A method of forming an exposure pattern on an outer surface of a mask for working will be described next. FIG. 7 is a flowchart of processing for forming the exposure pattern on the outer surface of the mask for working. FIG. 8 is a diagram supplementing the flowchart of FIG. 7.

As shown in FIG. 7, a mask of a shape corresponding to the shape of the inner surface of the workpiece (e.g., the workpiece 5 shown in FIG. 1) is formed. A light non-transmitive layer that is chrome deposited, plated or the like is provided on the surface (step S201), a resist is coated on the surface of the mask (step S202), and pre-baking is carried out (step S203).

An exposure pattern film is wound around the mask (step S204), and exposure (step S205), developing (step S206), and post-pre-baking (step S207) are then carried out.

Etching is carried out (step S208), the resist is peeled-off (step S209), and a negative/positive reversed pattern is formed on the surface of the mask (step S210).

In FIG. 7, the pattern is formed on the surface of the mask, by photoetching, by using an exposure pattern film. However, the present invention is not limited to the above. For example, instead of the exposure pattern film, laser light may be scanned three-dimensionally so as to expose a predetermined pattern directly on the resist layer.

Figure 9:
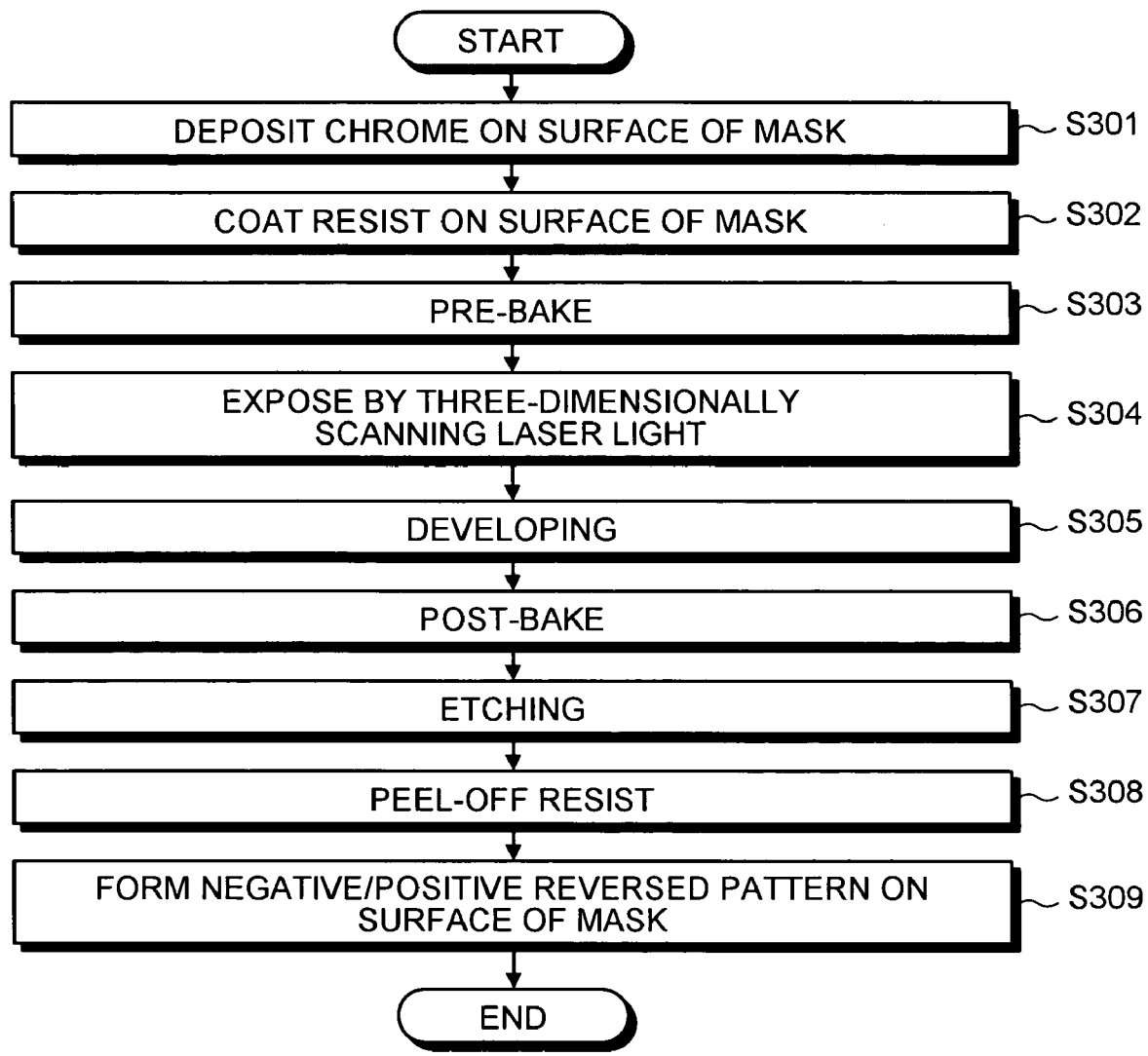
FIG. 9 is a flowchart of a process procedure for forming an exposure pattern on an outer surface of a mask by scanning laser light three-dimensionally.

FIG. 9 is a flowchart of processing for forming an exposure pattern on the outer surface of the mask for working by scanning laser light three-dimensionally. As shown in FIG. 9, a mask of a shape corresponding to the shape of the inner surface of the workpiece (e.g., the workpiece 5 shown in FIG. 1) is formed. A light non-transmitive layer that is chrome deposited, plated or the like is provided on the surface (step S301), the resist is coated on the surface of the mask (step S302), and pre-baking is carried out (step S303).

Exposure is carried out by three-dimensionally scanning laser light (step S304), and developing (step S305) and post-pre-baking (step S306) are then carried out.

Etching is carried out (step S307), the resist is peeled-off (step S308), and a negative/positive reversed pattern is formed on the surface of the mask (step S309).

Figure 10:
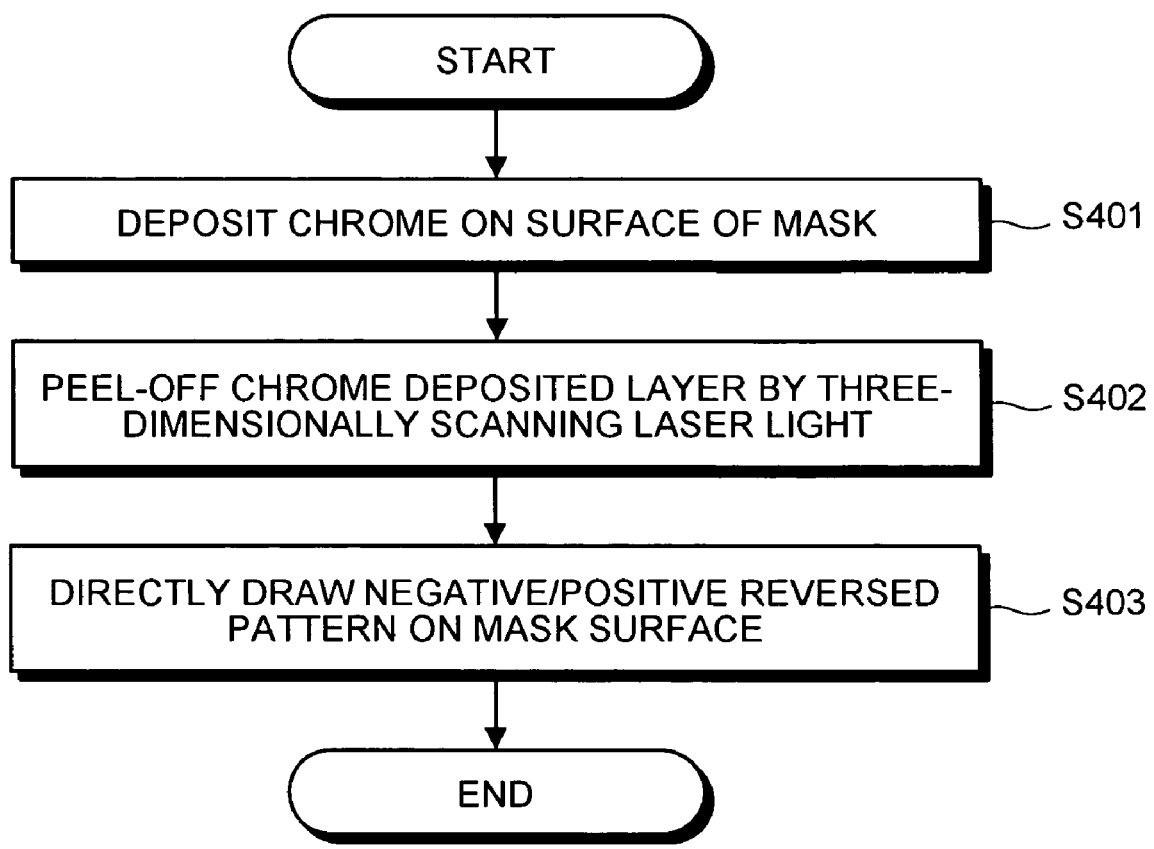
FIG. 10 is a flowchart of a process procedure for forming an exposure pattern on an outer surface of a mask by peeling-off a light non-transmitive layer of a mask surface.

The negative/positive reversed pattern may be drawn directly on the working mask by scanning laser light three-dimensionally and peeling-off the light non-transmitive layer of the mask surface. FIG. 10 is a flowchart of processing for forming an exposure pattern on the outer surface of the mask for working by peeling-off the light non-transmitive layer of the mask surface.

As shown in FIG. 10, a mask of a shape corresponding to the shape of the inner surface of the workpiece (e.g., the workpiece 5 shown in FIG. 1) is formed. A light non-transmitive layer that is chrome deposited, plated or the like is provided on the surface (step S401), the light non-transmitive layer is peeled-off by three-dimensionally scanning laser light (step S402), and a negative/positive reversed pattern is directly drawn on the mask surface (step S403).

Figure 11:
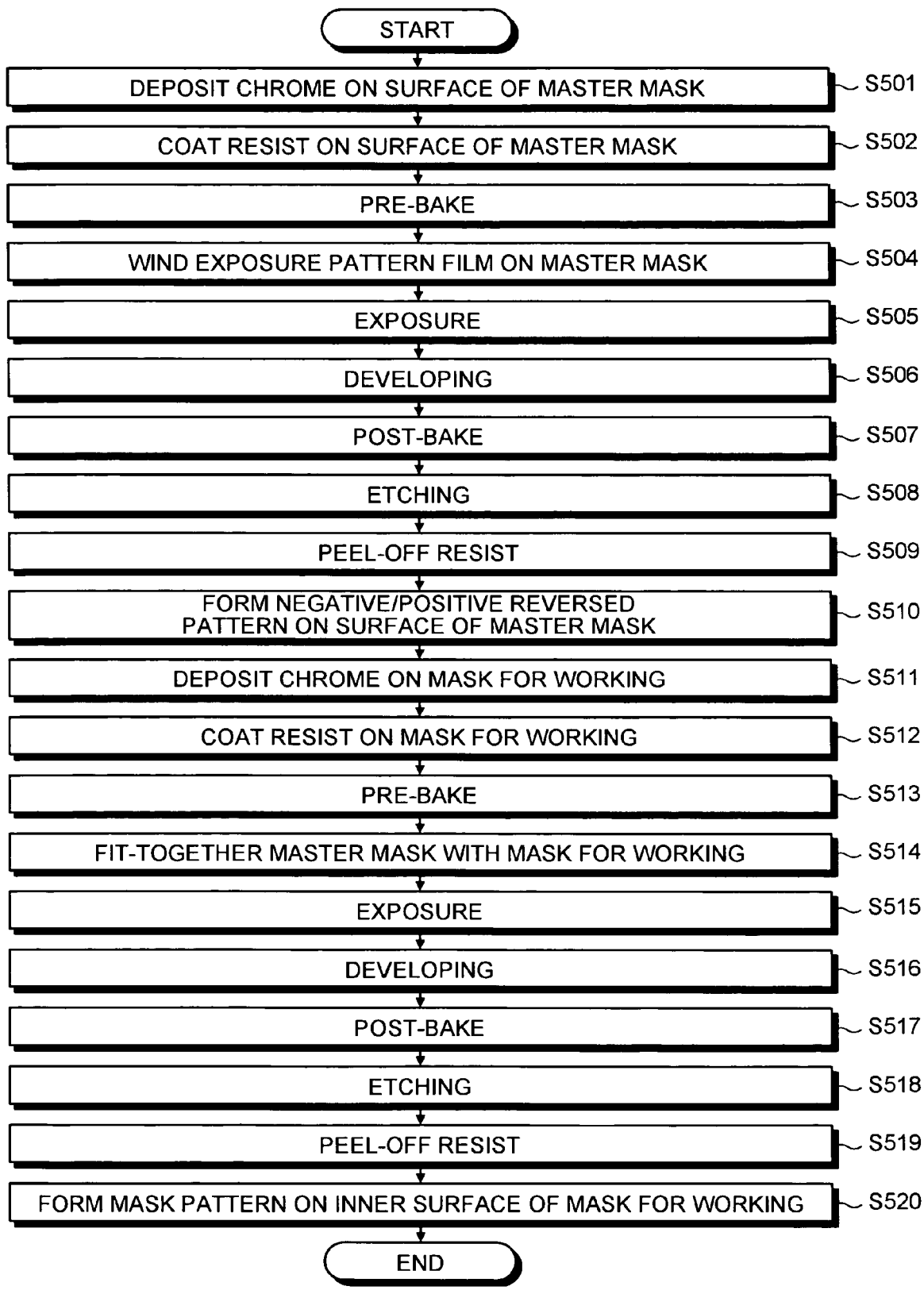
FIG. 11 is a flowchart of a process procedure for forming an exposure pattern on an inner surface of a mask.
Figure 12:
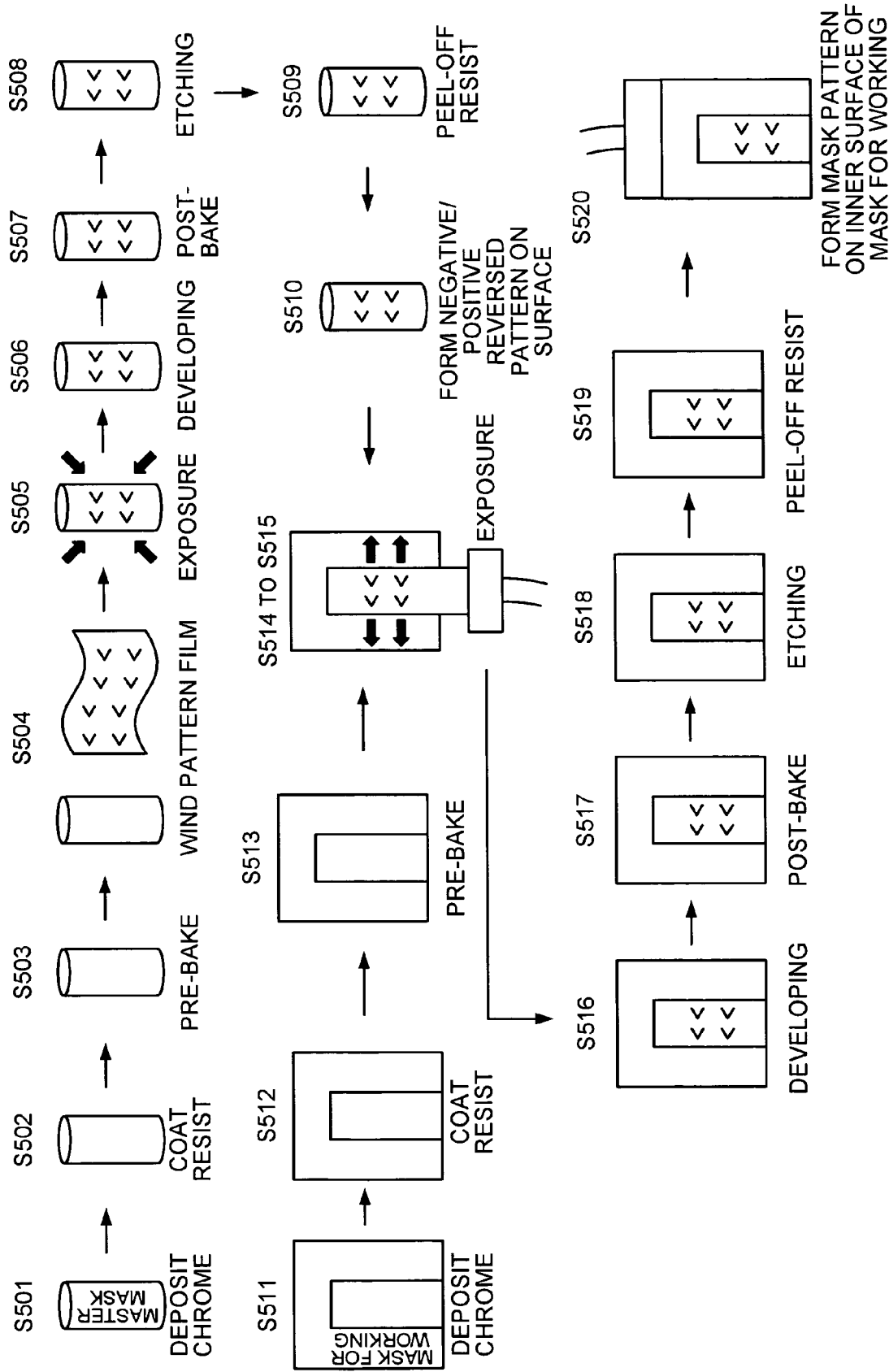
FIG. 12 is a schematic for explaining the process procedure shown in FIG. 11.

A method of forming an exposure pattern on the inner surface of the mask for working is described next. FIG. 11 is a flowchart of processing for forming the exposure pattern on the inner surface of the mask for working. FIG. 12 is a diagram supplementing the flowchart of FIG. 11.

As shown in FIG. 11, a master mask of a shape corresponding to the shape of the workpiece (e.g., the workpiece 8 shown in FIG. 4) is formed. A light non-transmitive layer that is chrome deposited, plated or the like is provided on the surface (step S501), the resist is coated on the surface of the master mask (step S502), and pre-baking is carried out (step S503).

The exposure pattern film is wound around the master mask (step S504), and exposure (step S505), developing (step S506), and post-baking (step S507) are then carried out.

Etching is carried out (step S508), the resist is peeled-off (step S509), and a negative/positive reversed pattern is formed on the surface of the master mask (step S510).

A light non-transmitive layer that is chrome deposited, plated or the like is provided on the mask for working (step S511), the resist is coated (step S512), and pre-baking is carried out (step S513). The master mask is fit-together with the mask for working (step S514), and exposure (step S515), developing (step S516), and post-baking (step S517) are then carried out.

Etching is carried out (step S518), the resist is peeled-off (step S519), and the mask pattern is formed on the inner surface of the mask for working (step S520).

A mask, at whose surface is formed a pattern at which negative and positive are reversed, is used as the master mask. Therefore, it is easy to manufacture the mask for working, which is a mask having a pattern at the inner surface thereof for carrying out etching, at the surface of a workpiece.

In FIG. 11, a pattern is formed on the surface of the master mask by photoetching by using an exposure pattern film. However, the present invention is not limited to the above. For example, as shown in FIG. 9, instead of the exposure pattern film, a predetermined pattern can be exposed directly on the resist layer by three-dimensionally scanning laser light. Further, as shown in FIG. 10, a negative/positive reversed pattern can be drawn directly by three-dimensionally scanning laser light and peeling-off a chrome layer of the surface of the master mask.

As described above, in the present embodiment, the mask pattern can be formed by forming a light non-transmitive layer and a resist on a surface of a workpiece, as well as by carrying out exposing, developing, and etching. Further, because it is easy to replace the mask with a mask of an arbitrary shape by the connector, the work efficiency can be improved. Moreover, because the flexible light guiding cable is used, the flexibility of the work layout can be increased.

According to the present invention, the resist is formed on the portion of the workpiece where the pattern is to be formed, exposure is carried out by using the mask connected by the light guiding cable with the connector, the pattern of the mask is transferred to the resist, the resist is developed, and the predetermined pattern is formed on the surface of the workpiece by etching. Therefore, the mask can be easily changed, and the work efficiency can be improved.

According to the present invention, the light guiding cables are connected to both ends of the mask, and light is incident from the both ends of the mask. Therefore, the exposure amount can be made uniform, and the mask pattern can be formed accurately on the surface of the workpiece.

According to the present invention, the resist is formed on the mask of the same shape as the workpiece, a pattern in which positive and negative are reversed is exposed on the mask, the resist is developed, a master mask, in which the pattern in which positive and negative are reversed is formed on a mask, is formed by etching, the resist is formed on a mask for working, the master mask is fitted together therewith, exposure is carried out from the master mask side, the resist is developed, and the pattern is formed by etching on the mask for working. Therefore, the mask for forming the pattern on the outer surface of the workpiece can be formed easily.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A mask pattern forming method of forming a pattern on a surface of a workpiece, comprising:
   depositing resist on a portion of the workpiece;
   transferring a pattern on a mask by exposing the mask with the pattern, the mask being exposed to a light from a light guiding cable with a connector, the mask being removable by the connector and being replaced with another mask according to a shape of the workpiece by the connector;
   developing the resist with the pattern; and
   forming the pattern on the surface of the workpiece by etching.

2. The mask pattern forming method according to claim 1, wherein the light guiding cable is connected to each of two ends of the mask and the mask is irradiated with light from the light guiding cables.

3. The mask pattern forming method according to claim 1, wherein the mask is fitted together with an interior or an exterior of the workpiece.

4. The mask pattern forming method according to claim 1, wherein a reflecting layer is provided at an end portion of the mask.

* * * * *